US011894222B2

(12) United States Patent
Takeuchi et al.

(10) Patent No.: US 11,894,222 B2
(45) Date of Patent: Feb. 6, 2024

(54) FILM FORMING APPARATUS AND FILM FORMING METHOD

(71) Applicant: Tokyo Electron Limited, Tokyo (JP)

(72) Inventors: Atsushi Takeuchi, Yamanashi (JP); Toru Kitada, Yamanashi (JP); Kanto Nakamura, Yamanashi (JP); Atsushi Gomi, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/354,121

(22) Filed: Jun. 22, 2021

(65) Prior Publication Data

US 2021/0407779 A1 Dec. 30, 2021

(30) Foreign Application Priority Data

Jun. 24, 2020 (JP) .................. 2020-108738

(51) Int. Cl.
*H01J 37/34* (2006.01)
*C23C 14/52* (2006.01)
*C23C 14/35* (2006.01)
*H10N 50/01* (2023.01)
*H10N 50/85* (2023.01)

(52) U.S. Cl.
CPC .......... *H01J 37/3461* (2013.01); *C23C 14/35* (2013.01); *C23C 14/52* (2013.01); *H01J 37/3405* (2013.01); *H01J 37/3426* (2013.01); *H01J 37/3479* (2013.01); *H10N 50/01* (2023.02); *H10N 50/85* (2023.02); *H01J 2237/24564* (2013.01); *H01J 2237/332* (2013.01)

(58) Field of Classification Search
None
See application file for complete search history.

(56) References Cited

U.S. PATENT DOCUMENTS

| 4,500,409 A | * | 2/1985 | Boys | ................ | H01J 37/3497 204/192.12 |
|---|---|---|---|---|---|
| 2005/0061666 A1 | * | 3/2005 | Gupta | ................ | H01J 37/3408 204/298.22 |
| 2010/0006424 A1 | * | 1/2010 | Chung | ................ | C23C 14/35 204/298.03 |
| 2012/0160672 A1 | * | 6/2012 | Endo | ................ | C23C 14/35 204/298.17 |

FOREIGN PATENT DOCUMENTS

| JP | H08-239764 A | 9/1996 |
| JP | H10-130833 A | 5/1998 |
| JP | 2000104167 A * | 4/2000 .......... H01J 37/3408 |
| JP | 2019-007076 A | 1/2019 |

* cited by examiner

*Primary Examiner* — Jason Berman
(74) *Attorney, Agent, or Firm* — Venjuris, P.C.

(57) ABSTRACT

A film forming apparatus for forming a film on a substrate by using a magnetron sputtering method. The film forming apparatus includes: a substrate holder configured to hold a substrate; a target holder configured to hold a target made of a ferromagnetic material to face the substrate holder; a magnet provided on a surface of the target holder opposite to the substrate holder, and configured to leak a magnetic field to a front surface of the target held by the target holder that is a surface close to the substrate holder; and a magnetic field strength measurement device configured to measure a strength of the magnetic field.

14 Claims, 5 Drawing Sheets

FILM FORMING APPARATUS AND FILM FORMING METHOD

CROSS-REFERENCE TO RELATED APPLICATIONS

The present application is based on and claims priority from Japanese Patent Application No. 2020-108738, filed on Jun. 24, 2020, with the Japan Patent Office, the disclosure of which is incorporated herein in its entirety by reference.

TECHNICAL FIELD

The present disclosure relates to a film forming apparatus and a film forming method.

BACKGROUND

Japanese Laid-Open Patent Publication No. 2019-007076 discloses a target wear detection mechanism. The target wear detection mechanism includes a substrate placed in a chamber, a target made of a material for forming a thin film on the substrate through a sputtering, a back plate that comes into contact with the back surface of the target to support and cool the target in the chamber, and a light detector attached to the back plate in order to detect the back surface of the target. The target is provided with a back groove which is cut in advance up to a depth position of an erosion region where the sputtering is stopped, within a range in which the back groove does not reach the outer periphery of the target from the back surface of the target. The light detector is disposed within the range where the back groove is formed, and detects the presence/absence of plasma light that passes through a wear hole formed when the erosion region of the target reaches the back groove through the sputtering.

SUMMARY

According to an aspect of the present disclosure, a film forming apparatus for forming a film on a substrate by using a magnetron sputtering method includes: a substrate holder configured to hold the substrate; a target holder configured to hold a target made of a ferromagnetic material to face the substrate holder; a magnet provided on a surface of the target holder opposite to the substrate holder, and configured to leak a magnetic field to a front surface of the target held by the target holder that is a surface close to the substrate holder; and a magnetic field strength measurement device configured to measure a strength of the magnetic field.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION OF THE DRAWINGS

Figure 1:
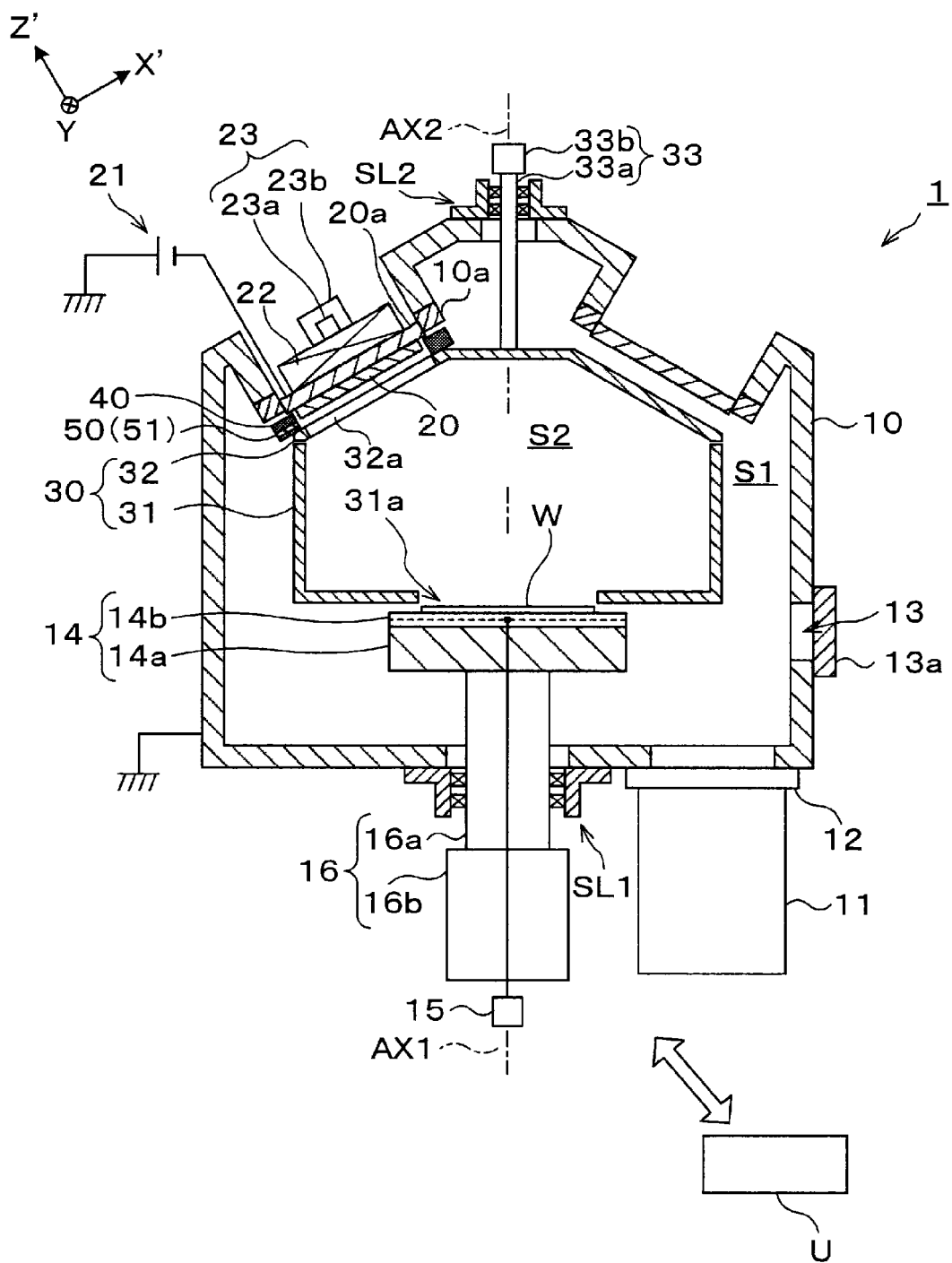
FIG. 1 is a vertical cross-sectional view illustrating a schematic configuration of a film forming apparatus according to a first embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

In a process of manufacturing a semiconductor device, a film forming process is performed to form a desired film such as a metal film on a substrate such as a semiconductor wafer (hereinafter, referred to as a "wafer"). For the film forming process, for example, a magnetron sputtering method is used.

In a film forming apparatus that performs the film formation using the magnetron sputtering method, a target made of a film forming material is provided to face, for example, a substrate on which a film is to be formed. Further, when the surface of the target which is close to the substrate on which a film is to be formed is the front surface of the target, the back surface of the target is provided with a magnet unit that includes a magnet. The magnet unit forms a magnetic field close to the front surface of the target. For example, when a radio-frequency power is supplied to the target, an inert gas such as Ar gas introduced into the atmosphere where the film forming process is performed is ionized. Electrons generated by the ionization drift by the magnetic field described above and the electric field generated by the radio-frequency power, so that high-density plasma is generated. The surface of the target is sputtered by ions generated from the ionization of the inert gas molecules in the plasma, and sputtered particles are deposited on the substrate so that a thin film is formed.

Since the surface of the target is sputtered as described above, the thickness of the target gradually becomes thinner. When the target is penetrated due to the wear of the target, the substrate or the film forming process chamber may be contaminated with, for example, a material of a holder that holds the target, or the target may be cracked causing the scattering of particles.

Thus, in the related art, for example, a timing for replacing the target is set based on the use performance of the target. However, since the wear amount of the target varies according to differences in process conditions or the like, the target replacement timing is set to a relatively early timing, and thus, in this method, it is difficult to use the target until the target is thoroughly worn.

Meanwhile, in the method of determining the target replacement timing disclosed in Japanese Laid-Open Patent Publication No. 2019-007076, the target is processed in advance to reach the depth position of the erosion region where the sputtering is stopped, in the region in which the back groove does not reach the outer periphery of the target from the back surface of the target. Further, the light detection unit detects the presence or absence of plasma light that passes through a wear hole formed when the erosion region of the target reaches the back groove by the sputtering, and the target replacement timing is determined based on the detection result.

However, the process of pre-processing the target requires considerable efforts and causes an increase in costs.

Thus, the technique according to the present disclosure enables to determine the target replacement timing without pre-processing the target.

Hereinafter, a film forming apparatus and a method of determining a target replacement timing according to the present disclosure will be described with reference to the drawings. In the descriptions and drawings herein below, components having substantially the same functional configuration will be designated by the same reference numerals, and overlapping descriptions thereof will be omitted.

First Embodiment

Figure 2:
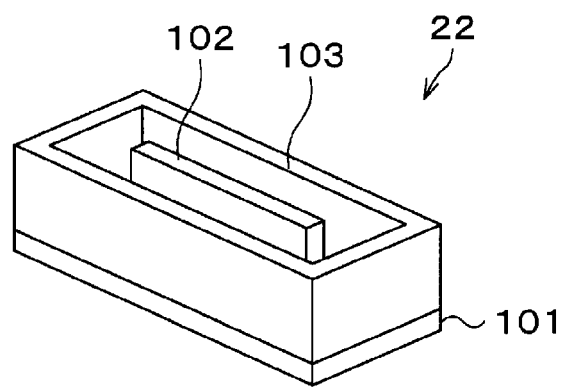
FIG. 2 is a perspective view of a magnet unit.
Figure 3:
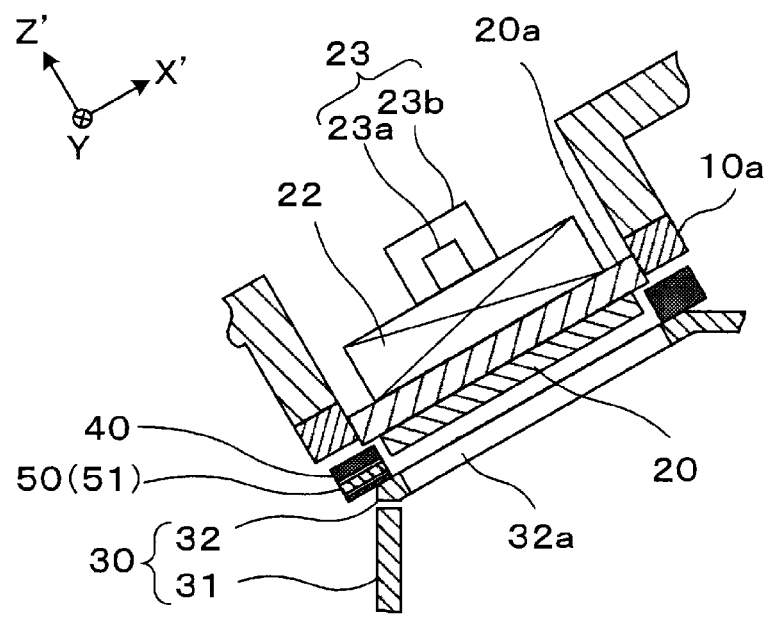
FIG. 3 is an enlarged view of a portion of FIG. 1.

FIG. 1 is a vertical cross-sectional view illustrating a schematic configuration of a film forming apparatus 1 according to a first embodiment. FIG. 2 is a perspective view of a magnet unit to be described later. FIG. 3 is an enlarged view of a portion of FIG. 1.

The film forming apparatus 1 of FIG. 1 forms a film on a substrate using the magnetron sputtering method, and specifically, forms a film of a ferromagnetic material on a wafer W which is a substrate. The ferromagnetic material is, for example, a single material such as Ni, Co or Fe, or a compound thereof. The film forming apparatus 1 includes a processing container 10.

The processing container 10 is configured to be depressurizable, accommodates the wafer W therein, is made of, for example, aluminum, and is connected to a ground potential. An exhaust device 11 is connected to the bottom of the processing container 10 to depressurize the space S1 inside the processing container 10 via an APC valve 12. Further, a carry-in/out port 13 for the wafer W is formed in the side wall of the processing container 10, and a gate valve 13a is provided in the carry-in/out port 13 to open/close the carry-in/out port 13.

A stage 14 is provided as a substrate support in the processing container 10. The wafer W is placed on the stage 14. Specifically, the wafer W is horizontally placed on the stage 14 so as to face the processing space S2 defined by a shield 30 to be described later. The stage 14 includes a base 14a and an electrostatic chuck 14b.

The base 14a is formed in a disk shape using, for example, aluminum. In the base 14a, a heater (not illustrated) is provided to heat the wafer W. Instead of the heater, a cooling mechanism may be provided, or both the heater and the cooling mechanism may be provided.

The electrostatic chuck 14b includes a dielectric film and an electrode provided as an inner layer of the dielectric film, and is provided on the base 14a. A DC power supply 15 is connected to the electrode of the electrostatic chuck 14b. The wafer W placed on the electrostatic chuck 14b is adsorbed and held on the electrostatic chuck 14b by an electrostatic attraction force.

The stage 14 is connected to a rotation/movement mechanism 16. The rotation/movement mechanism 16 includes, for example, a support shaft 16a and a driving unit 16b.

The support shaft 16a extends vertically to penetrate the bottom wall of the processing container 10. A sealing member SL1 is provided between the support shaft 16a and the bottom wall of the processing container 10. The sealing member SL1 seals the space between the bottom wall of the processing container 10 and the support shaft 16a such that the support shaft 16a is rotatable and movable, and is, for example, a magnetic fluid seal. The upper end of the support shaft 16a is connected to the center of the lower surface of the stage 14, and the lower end thereof is connected to the driving unit 16b.

The driving unit 16b includes, for example, a motor, and generates a driving force for rotating and moving the support shaft 16a up and down. When the support shaft 16a rotates around an axis AX1 thereof, the stage 14 rotates around the axis AX1, and when the support shaft 16a moves up and down, the stage 14 moves up and down.

A metal holder 20a is provided above the stage 14 to hold a target 20 made of Ni. The holder 20a holds the target 20 such that the target 20 is placed inside the processing container 10. The holder 20a is attached to the ceiling of the processing container 10. A through hole is formed at the position of the processing container 10 to which the holder 20a is attached. Further, an insulating member 10a is provided on the inner wall surface of the processing container 10 to surround the through hole. The holder 20a is attached to the processing container 10 via the insulating member 10a so as to close the through hole.

The holder 20a holds the target 20 such that the front surface of the target 20 faces the stage 14, and extends in the depth direction of the apparatus (Y direction in FIG. 1).

The target 20 is formed in a rectangular shape in a plan view. The length of the target 20 in the depth direction of the apparatus (Y direction in FIG. 1) is longer than the diameter of the wafer W on which a film is to be formed. When the diameter of the wafer W on which a film is to be formed is 300 mm, the length of the target 20 in the depth direction of the apparatus (Y direction in FIG. 1) is, for example, 400 mm to 500 mm. Further, the length of the target 20 in the direction (X' direction in FIG. 1) perpendicular to the depth direction of the apparatus (Y direction in FIG. 1) is, for example, 150 mm to 200 mm.

A power supply 21 is connected to the holder 20a, and a negative DC voltage is applied from the power supply 21. Instead of the negative DC voltage, an AC voltage may be applied.

Further, a magnet unit 22 is provided at a position on the back surface of the holder 20a outside the processing container 10.

The magnet unit 22 forms a magnetic field that leaks to the front surface of the target 20 held by the holder 20a, and is configured such that, for example, a rectangular parallelepiped central magnet 102 and an outer peripheral magnet 103 having a rectangular ring shape in a plan view are arranged on a flat plate-shaped yoke 101, as illustrated in FIG. 2. The central magnet 102 is provided along the longitudinal direction of the yoke 101, and the outer peripheral magnet 103 is provided to surround the four sides of the central magnet 102 in a plan view. The central magnet 102 and the outer peripheral magnet 103 are magnetized in opposite directions in the direction perpendicular to the surface of the yoke 101 close to the central magnet 102.

The magnet unit 22 is provided such that, for example, the central magnet 102 extends in the direction (X' direction in FIG. 1) perpendicular to the depth direction of the apparatus (Y direction in FIG. 1) in a plan view. Further, the length of the magnet unit 22 in the depth direction of the apparatus (Y direction in FIG. 1) is, for example, about ⅛ times to ⅕ times the length of the target 20 in the depth direction of the apparatus (Y direction in FIG. 1), and specifically, 45 mm to 100 mm. The length of the magnet unit 22 in the direction (X' direction in FIG. 1) perpendicular to the depth direction of the apparatus (Y direction in FIG. 1) is substantially the same as the length of the target 20.

The magnet unit 22 described above is connected to a movement mechanism 23 as illustrated in FIG. 1.

The movement mechanism 23 swings the magnet unit 22 along the back surface of the holder 20a in the depth direction of the apparatus (Y direction in FIG. 1), and includes a rail 23a that extends along, for example, the depth direction of the apparatus (Y direction in FIG. 1), and a driving unit 23b that includes a motor or the like. By the driving force generated by the driving unit 23b, the magnet unit 22 moves along the rail 23a in the depth direction of the apparatus (Y direction in FIG. 1). More specifically, by the driving force generated by the driving unit 23b, the magnet unit 22 reciprocates between one end of the target 20 in the depth direction of the apparatus (the negative end in the Y direction of FIG. 1) and the other end of the target 20 in the depth direction of the apparatus (the positive end in the Y direction of FIG. 1). A controller U to be described later controls the driving unit 23b.

By swinging the magnet unit 22 using the movement mechanism 23, the substantially entire target 20 may be used.

Further, the film forming apparatus 1 includes the shield 30 that forms the processing space S2 inside the processing container 10. The shield 30 is provided inside the processing container 10.

The shield 30 includes a first shield member 31 and a second shield member 32. The first shield member 31 and the second shield member 32 are formed of, for example, aluminum. The shield 30 is configured to be rotatable around a support shaft 33a to be described later, and specifically, the second shield member 32 of the shield 30 is configured to be rotatable around the support shaft 33a.

The first shield member 31 is a pot-shaped member that is opened at the upper portion thereof, and has a hole 31a in the bottom surface thereof to expose the processing space S2 to the wafer W placed on the stage 14. The first shield member 31 is supported in the processing container 10 via, for example, a support member (not illustrated).

The second shield member 32 is a lid member that closes the opening of the upper portion of the first shield member 31, and is formed such that the center thereof in a plan view projects upward. The second shield member 32 has an opening 32a. Sputtered particles from the target 20 held in the holder 20a are supplied to the processing space S2 through the opening 32a.

The second shield member 32 is connected to a rotation mechanism 33. The rotation mechanism 33 includes, for example, a support shaft 34a which is a rotation shaft, and a driving unit 33b.

The support shaft 33a extends vertically to penetrate the top wall of the processing container 10, and pivotally supports the second shield member 32. A sealing member SL2 is provided between the support shaft 33a and the top wall of the processing container 10. The sealing member SL2 seals the space between the top wall of the processing container 10 and the support shaft 33a such that the support shaft 33a is rotatable, and is, for example, a magnetic fluid seal. The lower end of the support shaft 33a is connected to the center of the upper surface of the second shield member 32, and the upper end thereof is connected to the driving unit 33b.

The driving unit 33b includes, for example, a motor, and generates a driving force for rotating the support shaft 33a. When the support shaft 33a rotates around an axis AX2 thereof, the second shield member 32 rotates around the axis AX2.

By rotating the second shield member 32 using the driving unit 33b, the opening 32a of the second shield member 32 may be caused to face the target 20 held by the holder 20a, or a portion of the second shield member 32 where the opening 32a is not formed may be caused to face the target 20.

Further, the film forming apparatus 1 includes a gas supply (not illustrated) that supplies a gas into the processing space S2. The gas supply includes, for example, a gas source, a flow rate controller such as a mass flow controller, and a gas introduction unit. The gas source stores a gas (e.g., Ar gas) that is excited in the processing container 10. The gas source is connected to the gas introduction unit via the flow rate controller. The gas introduction unit is a member that introduces a gas from the gas source into the processing container 10.

When a gas is supplied from the gas supply, and a power is supplied to the target 20 by the power supply 21, the gas supplied into the processing container 10 is excited. Further, a magnetic field is generated by the magnet unit 22 in the vicinity of the front surface of the target 20, and plasma is concentrated on the vicinity of the front surface of the target 20. Then, when positive ions in the plasma collide with the target 20, the substance that makes up the target 20 is released from the target 20 as sputtered particles. As a result, Ni is deposited on the wafer W so that a Ni film is formed.

Further, the film forming apparatus 1 includes a contamination prevention member 40.

The contamination prevention member 40 prevents the inside of the processing container 10 from being contaminated by the sputtered particles from the target 20 held in the holder 20a, and is formed of, for example, aluminum. The contamination prevention member 40 is provided to close the space between the peripheral edge of the holder 20a and the second shield member 32.

Further, the contamination prevention member 40 is provided in an annular shape which is similar to, for example, the insulating member 10a.

Further, the film forming apparatus 1 includes a Gauss meter 50 as a magnetic field strength measuring unit that measures the strength of the magnetic field. The Gauss meter 50 includes, for example, a hole probe 51 with a hole sensor provided therein. The number of hole probes 51 is, for example, one. The hole probe 51 is provided to be able to detect the leakage magnetic field formed by the magnet unit 22 in the space in front of the target 20. Specifically, for example, as illustrated in FIG. 3, the hole probe 51 is provided such that the hole probe 51 is inserted through a through hole that penetrates the contamination prevention member 40 from the outer periphery of the contamination prevention member 40 to the inner periphery of the same, and a sensing unit at the tip of the hole probe is exposed to the space in front of the target 20. Further, the sensing unit at the tip of the hole probe 51 is provided at, for example, a position substantially coincident with the center of the target 20 held by the holder 20a in the depth direction of the apparatus (Y direction in FIG. 3). The hole probe 51 may be provided at a position close to the target 20 within a range in which an adhesion of a film does not occur.

The measurement result in the Gauss meter 50 is output to the controller U to be described later.

The magnetic field strength measured by the Gauss meter 50 increases with the increase of the wear amount of the target 20, that is, with the decrease of the thickness of the remaining target 20 (hereinafter, may be referred to as the "remaining thickness"). This is because the target 20 becomes thinner as the wear amount of the target 20 increases so that the strength of the magnetic field that leaks to the front surface of the target 20 made of a ferromagnetic material increases.

Thus, in the film forming apparatus 1, the controller U to be described later determines a timing for replacing the target 20 based on the measurement result in the Gauss meter 50.

As illustrated in FIG. 1, the film forming apparatus 1 further includes the controller U. The controller U is configured by, for example, a computer provided with a CPU, a memory or the like, and includes a program storage unit (not illustrated). The program storage unit stores a program for controlling, for example, the driving units 16b, 23b, and 33b to implement the film forming process to be described later in the film forming apparatus 1, and also stores a program for determining the timing for replacing the target 20 based on the measurement result in the Gauss meter 50. The programs may be recorded on a computer-readable storage medium, and may be installed from the storage medium to the controller U. Further, a portion or all of the programs may be implemented by dedicated hardware (circuit board).

[Film Forming Method]

Next, an example of a film forming method that uses the film forming apparatus 1 will be described.

(Carrying-In)

First, under the control of the controller U, the wafer W is carried into the processing container 10 adjusted to a desired pressure. Specifically, the gate valve 13a is opened, and a transfer mechanism (not illustrated) that is holding the wafer W is inserted into the processing container 10 from a vacuum-atmosphere transfer chamber (not illustrated) adjacent to the processing container 10 through the carry-in/out port 13. Then, the wafer W is transferred above the stage 14. Subsequently, the wafer W is transferred onto a lifted support pin (not illustrated). Then, the transfer mechanism retreats from the processing container 10, and the gate valve 13a is closed. At the same time, the support pin moves downward such that the wafer W is placed on the stage 14, and adsorbed and held by the electrostatic attraction force of the electrostatic chuck 14b. Further, the stage 14 moves upward such that the wafer W moves directly below the hole 31a of the shield 30.

(Forming Ni Film)

Subsequently, a Ni film is formed by the magnetron sputtering method. Specifically, the stage 14 is rotated by the rotation/movement mechanism 16, and for example, Ar gas is supplied from a gas supply (not illustrated) into the processing container 10. Further, a power is supplied from the power supply 21 to the target 20. At the same time, the magnet unit 22 is moved by the movement mechanism 23 to repeatedly reciprocate, that is, swing, above the target 20 along the depth direction of the apparatus (Y direction in FIG. 1). The Ar gas in the processing container 10 is ionized by the power supplied from the power supply 21, and electrons generated by the ionization drift by the magnetic field (i.e., the leakage magnetic field) formed in front of the target 20 by the magnet unit 22, thereby generating high-density plasma. The Ar ions generated in the plasma sputter the surface of the target 20, and the sputtered particles of Ni are deposited on the wafer W, thereby forming a Ni film.

(Carrying-Out)

Then, the wafer W is carried out from the processing container 10. Specifically, the wafer W is carried out from the processing container 10 according to the reverse operation of the carrying-in operation.

Then, the process returns to the carrying-in step described above, and the wafer W on which a film is to be filmed next is processed in the same manner.

[Method of Determining Replacement Timing]

Next, an example of a process of determining a target replacement timing in the film forming apparatus 1 will be described. The process of determining a target replacement timing is performed when the generation of plasma is unnecessary, for example, during the maintenance of the film forming apparatus 1 or during a cleaning performed between the film forming process and the next film forming process.

(Movement of Magnet Unit 22)

First, under the control of the controller U, the magnet unit 22 moves to a predetermined position in the depth direction of the apparatus (Y direction in FIG. 1). The predetermined position is, for example, a position close to the hole probe 51. More specifically, when the sensing unit at the tip of the hole probe 51 is provided at the position substantially coincide with the center of the target 20 held by the holder 20a in the depth direction of the apparatus (Y direction in FIG. 1) as described above, the predetermined position is the position that faces the center of the target 20.

(Measurement of Magnetic Field Strength)

Subsequently, the magnetic field is measured by the Gauss meter 50. More specifically, the Gauss meter 50 measures the strength of the leakage magnetic field formed by the magnet unit 22 in front of the target 20, and the measurement result is output to the controller U.

(Determination of Replacement Timing)

Then, the controller U determines a timing for replacing the target 20, based on the measurement result of the magnetic field strength by the magnet unit 22. Specifically, for example, when the magnetic field strength measured by the magnet unit 22 exceeds a predetermined threshold Th1, the controller U determines that the timing for replacing the target 20 is approaching, and when the magnetic field strength exceeds a threshold Th2 (Th2>Th1), the controller U determines that the target 20 needs to be replaced.

The controller U notifies the result of the determination described above by using a notification unit such as, for example, a display unit (not illustrated) or an audio output unit (not illustrated).

As described above, in the present embodiment, the Gauss meter 50 is provided in the film forming apparatus 1, and measures the strength of the leakage magnetic field that is formed by the magnet unit 22 in front of the target 20 and varies according to the wear amount of the target 20, that is, the remaining thickness. Thus, the timing for replacing the target 20 may be appropriately determined based on the measurement result of the strength of the leakage magnetic field, that is, based on the predicted remaining thickness of the target 20 in real time. Accordingly, the target 20 may be replaced before the target 20 is penetrated, by, for example, appropriately setting the above-described threshold Th2.

As the method of determining the target replacement timing, it may be considered to adopt a method of capturing an image of the surface of the target with a camera, and determining the target replacement timing from the result of the image capturing, in addition to the method according to the present embodiment. However, since only the state of the surface of the target may be observed from the result of the image capturing, it may be difficult to grasp the remaining thickness of the target. Thus, in the determination method based on the result of the image capturing, the target is replaced once the target is penetrated. Meanwhile, according to the present embodiment, the target 20 may be replaced before the target 20 is penetrated as described above. Thus, according to the present embodiment, the target 20 may be used as much as possible without causing the contamination of the wafer W or the inside of the processing container 10 due to the sputtering of the holder 20*a*, and without causing cracks in the target 20.

Further, the method of determining the timing for replacing the target 20 according to the present embodiment does not require the pre-processing of the target 20 which may cause considerable efforts and the increase in costs. Further, according to the present embodiment, the determination of the timing for replacing the target 20 may be performed without opening the inside of the processing container 10 to the atmosphere.

As in the present embodiment, when the magnet unit 22 is swung along the depth direction of the apparatus (Y direction in FIG. 1) during the film formation, the wear amount of the target 20 is the largest at the center of the target 20 in the depth direction of the apparatus. Accordingly, as described above, the sensing unit of the hole probe 51 is provided at the position coincide with the center of the target 20 in the depth direction of the apparatus (Y direction in FIG. 1), and when the determination of a target replacement timing is performed, the magnet unit 22 is provided at the position close to the hole probe 51, so that the timing for replacing the target 20 may be more appropriately determined.

While the number of hole probes 51 is one in the configuration described above, a plurality of hole probes 51 may be provided. Then, the timing for replacing the target 20 may be determined based on a statistical value (e.g., an average value) of measurement results from the plurality of hole probes 51.

Second Embodiment

Figure 4:
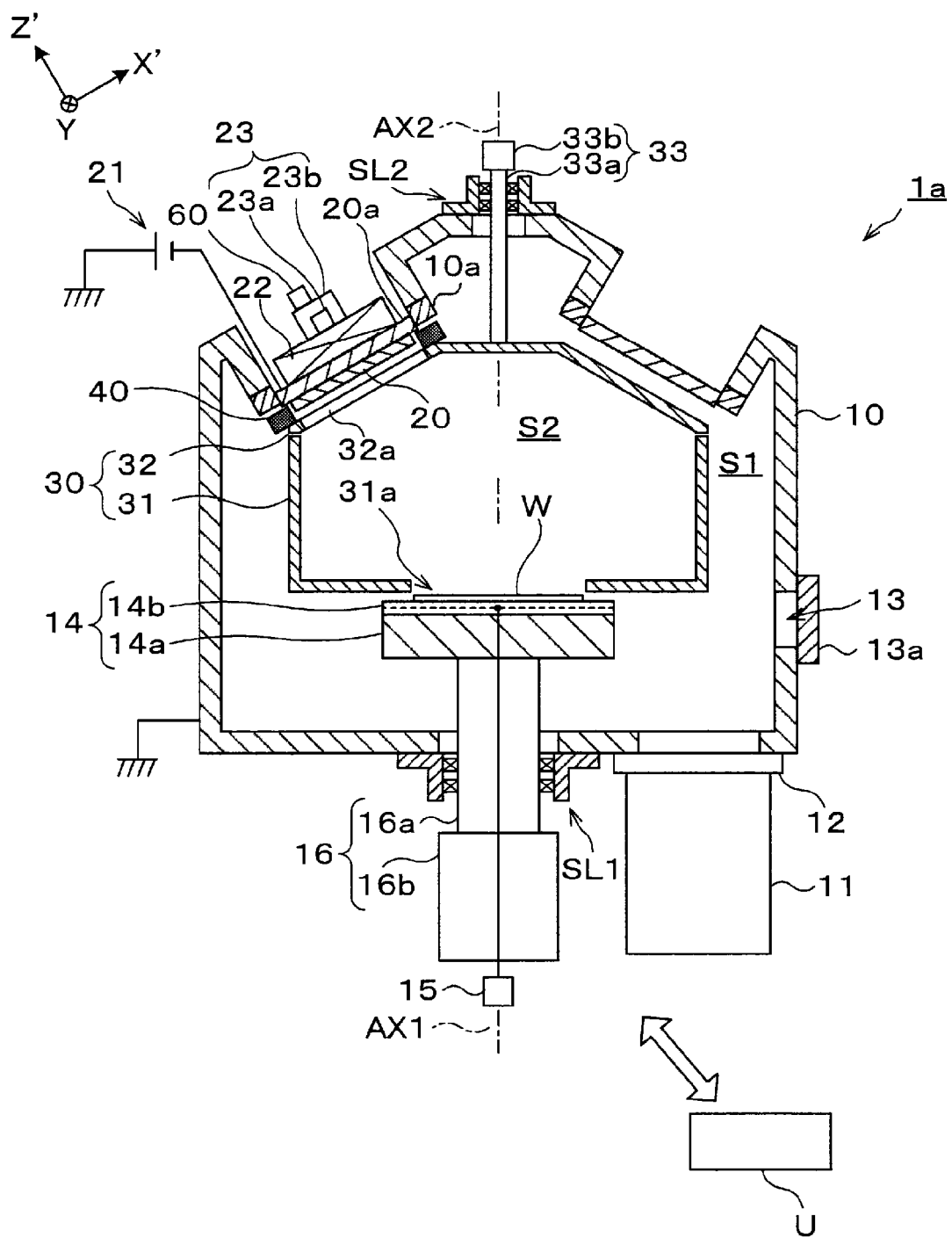
FIG. 4 is a vertical cross-sectional view illustrating a schematic configuration of a film forming apparatus according to a second embodiment.

FIG. 4 is a vertical cross-sectional view illustrating a schematic configuration of a film forming apparatus 1*a* according to a second embodiment.

The film forming apparatus 1*a* of FIG. 4 is provided with a torque sensor 60 which is a detection unit that detects the load of the driving unit 23*b*, instead of the Gauss meter 50 of the film forming apparatus 1 of FIG. 1. For example, the torque sensor 60 is provided to detect the torque of the motor included in the driving unit 23*b*.

A torque value obtained from the measurement by the torque sensor 60 decreases as the wear amount of the target 20 increases. The reason is described as follows. The target 20 made of a ferromagnetic material is magnetized by the magnet unit 22. Thus, as the wear amount of the target 20 increases, the target 20 becomes thinner, and the degree of the magnetization of the target 20 decreases. Accordingly, as the wear amount of the target 20 increases, the magnetic force that acts between the target 20 and the magnet unit 22 also decreases, so that the driving force required to swing the magnet unit 22 decreases. Thus, the torque value obtained from the measurement by the torque sensor 60 decreases as the wear amount of the target 20 increases.

Thus, in the film forming apparatus 1*a*, the controller U determines the timing for replacing the target 20 based on the measurement result in the torque sensor 60. Specifically, for example, when the torque value obtained from the measurement by the torque sensor 60 falls below a predetermined threshold Th3, the controller U determines that the timing for replacing the target 20 is approaching, and when the torque value falls below a threshold Th4 (Th4<Th3), the controller U determines that the target 20 needs to be replaced. Then, the controller U notifies the determination result described above by using, for example, a display unit (not illustrated) or an audio output unit (not illustrated).

In the present embodiment as well, the target 20 may be used as much as possible without causing the contamination of the wafer W or the inside of the processing container 10 due to the sputtering of the holder 20*a*, and without causing cracks in the target 20. Further, in the present embodiment as well, the pre-processing of the target is unnecessary. Further, in the present embodiment as well, the determination of the timing for replacing the target 20 may be performed without opening the inside of the processing container 10 to the atmosphere.

Further, in the present embodiment as well, the determination of the replacement timing is performed during, for example, the maintenance of the film forming apparatus 1*a* or during a cleaning performed between the film forming process and the next film forming process.

Further, in the present embodiment as well, the magnet unit 22 may be moved to the position that faces the center of the target 20 in the depth direction of the apparatus (Y direction in FIG. 1) when the determination of the replacement timing is performed. As a result, the timing for replacing the target 20 may be more appropriately determined.

Third Embodiment

Figure 5:
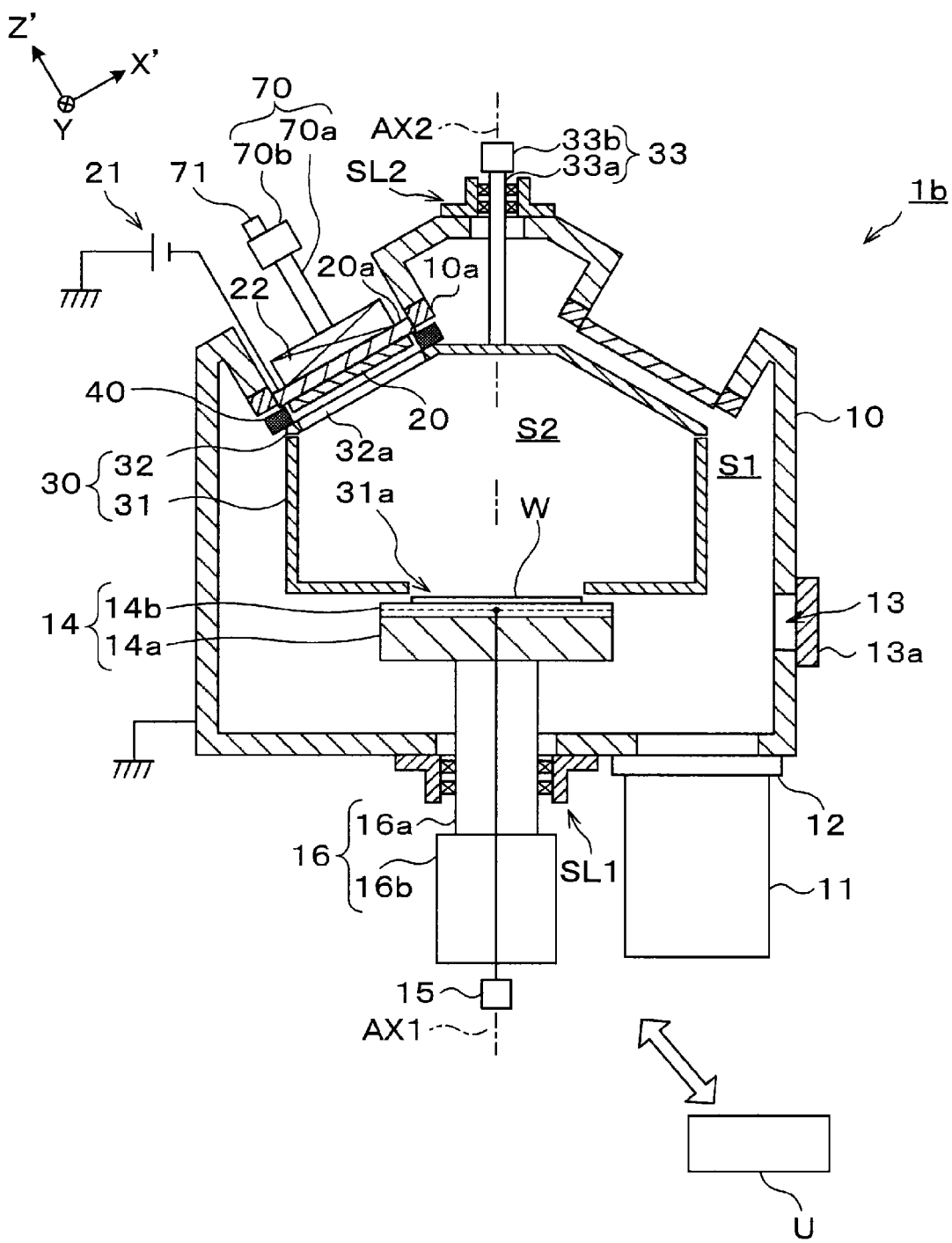
FIG. 5 is a vertical cross-sectional view illustrating a schematic configuration of a film forming apparatus according to a third embodiment.

FIG. 5 is a vertical cross-sectional view illustrating a schematic configuration of a film forming apparatus 1*b* according to a third embodiment.

The film forming apparatus 1*b* of FIG. 5 includes a movement mechanism 70 that moves the magnet unit 22 in the direction in which the magnet unit 22 approaches/is separated from the holder 20*a* (Z' direction of FIG. 5).

The movement mechanism 70 includes a rail 70*a* that extends along the approaching/separating direction (Z' direction in FIG. 5), and a driving unit 70*b* that includes, for example, a motor. By the driving force generated by the driving unit 70*b*, the magnet unit 22 moves along the rail 70*a* in the approaching/separating direction (Z' direction in FIG. 5). The controller U controls the driving unit 70*b*.

The movement mechanism 70 moves the magnet unit 22 in the approaching/separating direction (Z' direction in FIG. 5) in accordance with the wear amount of the target 20, such that the leakage magnetic field formed by the magnet unit 22 in front of the target 20 becomes constant, regardless of the wear amount of the target 20.

In addition to the movement mechanism 70, the movement mechanism 23 of FIG. 1 may be provided such that the magnet unit 22 is further movable in the depth direction of the apparatus (Y direction of FIG. 5).

In the present embodiment, a torque sensor 71 is provided as a detection unit that detects the load of the driving unit 70*b*, to detect, for example, the torque of a motor included in the driving unit 70*b*.

A torque value obtained from the measurement by the torque sensor 71 decreases as the wear amount of the target 20 increases.

Thus, in the film forming apparatus 1*b*, the controller U determines the timing for replacing the target 20 based on the measurement result in the torque sensor 71. Specifically, for example, when the torque value obtained from the measurement by the torque sensor 71 falls below a predetermined threshold Th5, the controller U determines that the timing for replacing the target 20 is approaching, and when the torque value falls below a threshold Th6 (Th6<Th5), the controller U determines that the target 20 needs to be replaced. Then, the controller U notifies the determination result described above by using, for example, a display unit (not illustrated) or an audio output unit (not illustrated).

The reason why the torque value obtained from the measurement by the torque sensor 71 decreases as the wear amount of the target 20 increases is the same as the reason why the torque value obtained from the measurement by the torque sensor 60 decreases as the wear amount of the target 20 increases.

In the present embodiment as well, the target 20 may be used as much as possible without causing the contamination of the wafer W or the inside of the processing container 10 due to the sputtering of the holder 20a, and without causing cracks in the target 20. Further, in the present embodiment as well, the pre-processing of the target is unnecessary. Further, in the present embodiment as well, the determination of the timing for replacing the target 20 may be performed without opening the inside of the processing container 10 to the atmosphere.

In the present embodiment, when the magnet unit 22 is swung in the depth direction of the apparatus (Y direction in FIG. 5), the difference in wear amount between the peripheral edge and the center of the target 20 increases as the time for the film formation increases. Thus, when the distance between the target 20 and the magnet unit 22 is constant at both the center and the peripheral edge of the target 20, the strength of the magnetic field formed in front of the target 20 is not equal at the center and the peripheral edge of the target 20. Accordingly, the magnet unit 22 may be further separated from the holder 20a during the time when the magnet unit 22 faces the center of the target 20. Further, when the magnet unit 22 is swung in the depth direction of the apparatus (Y direction in FIG. 5), the magnet unit 22 may be moved to the position that faces the center of the target 20 in the depth direction of the apparatus (Y direction in FIG. 5) during the determination of the replacement timing. As a result, the timing for replacing target 20 may be more appropriately determined.

[Verification Text]

Figure 6:
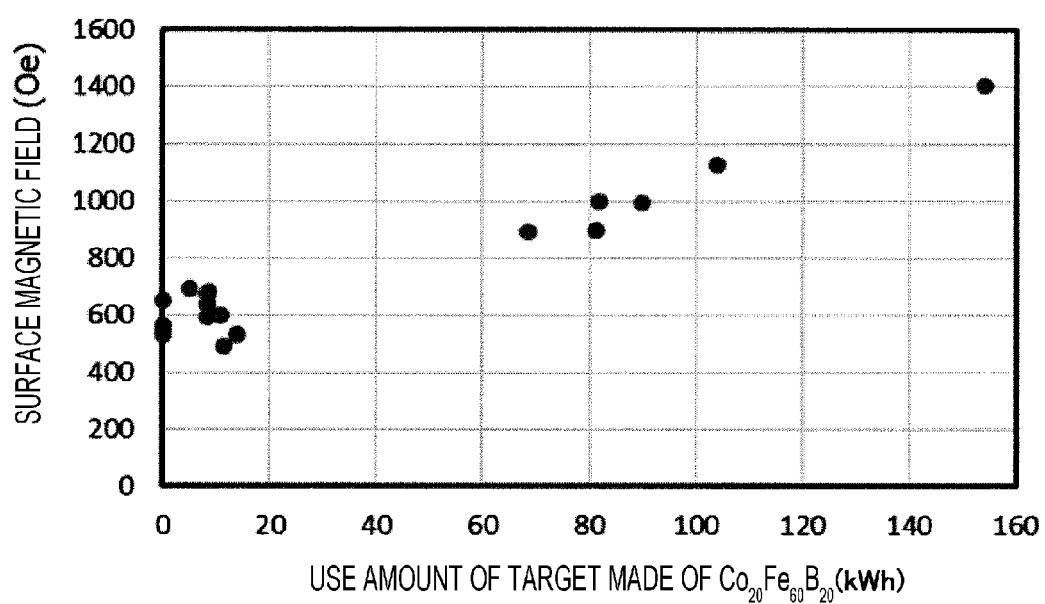
FIG. 6 is a view illustrating a result of a verification test.

A verification test was conducted on the relationship between the wear amount of the target 20 and the strength of the leakage magnetic field formed in front of the target 20 (hereinafter, the leakage magnetic field strength of the target surface), using a film forming apparatus having the configuration of the film forming apparatus 1 of FIG. 1 except for the Gauss meter 50, and using a target made of $Co_{20}Fe_{60}B_{20}$ as the target 20 made of the ferromagnetic material. FIG. 6 illustrates the result. In FIG. 6, the horizontal axis represents a product of the power supplied to the target 20 and the supply time as the wear amount of the target 20, and the vertical axis represents the leakage magnetic field strength of the target surface. In the verification test, the leakage magnetic field strength of the target surface was measured in a state where the magnet unit 22 was moved to the position that faces the center of the target 20. Further, the horizontal magnetic field formed by the magnet unit 22 in front of the target 20 in a racetrack shape in a plan view was measured at eight points along the racetrack (four corners of the racetrack and intermediate points of the four respective straight portions of the racetrack). The average value of the measurement values was taken as the "leakage magnetic field strength of the target surface."

As illustrated in FIG. 6, the leakage magnetic field strength of the target surface increases as the wear amount of the target 20 made of $Co_{20}Fe_{60}B_{20}$ increases.

From this point, it is verified that the use amount of the target 20 made of $Co_{20}Fe_{60}B_{20}$ may be predicted, or the timing for replacing the target 20 made of $Co_{20}Fe_{60}B_{20}$ may be appropriately determined, based on the measurement result obtained by measuring the leakage magnetic field strength of the target surface.

According to the present disclosure, a target replacement timing may be determined without pre-processing the target.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A film forming apparatus comprising:
    a substrate holder configured to hold a substrate for forming a film thereon by a magnetron sputtering;
    a target holder configured to hold a target made of a ferromagnetic material to face the substrate holder and extend in a depth direction of the film forming apparatus;
    a magnet provided on a surface of the target holder opposite to the substrate holder, and configured to leak a magnetic field to a front surface of the target held by the target holder that is a surface close to the substrate holder;
    a driver configured to swing the magnet along a back surface of the target holder in the depth direction of the film forming apparatus; and
    a Gauss meter including a hole probe with a hole sensor provided therein and configured to measure a strength of the magnetic field,
    wherein a tip of the hole probe is provided at a position substantially coincident with a center of the target held by the target holder in the depth direction of the film forming apparatus.

2. The film forming apparatus according to claim 1, further comprising:
    a controller configured to control an overall operation of the film forming apparatus,
    wherein the controller determines a timing for replacing the target based on a measurement result obtained from the Gauss meter.

3. A film forming apparatus comprising:
    a substrate holder configured to hold a substrate for forming a film thereon by a magnetron sputtering;
    a target holder configured to hold a target made of a ferromagnetic material to face the substrate holder;
    a magnet provided on a surface of the target holder opposite to the substrate holder, and configured to leak a magnetic field to a front surface of the target held by the target holder that is a surface close to the substrate holder;
    a motor configured to move the magnet with respect to the target holder;
    a torque sensor configured to detect a torque value of the motor; and
    a controller configured to control an overall operation of the film forming apparatus,
    wherein the controller determines a timing for replacing the target based on the torque value detected by the torque sensor.

4. The film forming apparatus according to claim 3, wherein the motor moves the magnet along the surface of the target holder opposite to the substrate holder.

5. The film forming apparatus according to claim 4, wherein the motor moves the magnet in a direction in which the magnet approaches and is separated from the target holder.

6. The film forming apparatus according to claim 3, wherein the motor moves the magnet in a direction in which the magnet approaches and is separated from the target holder.

7. A method of determining a timing for replacing a target in a film forming apparatus, wherein the target is made of a ferromagnetic material, the film forming apparatus includes a substrate holder configured to hold a substrate for forming a film thereon by a magnetron sputtering, a target holder configured to hold the target to face the substrate holder and extend in a depth direction of the film forming apparatus, a magnet provided on a surface of the target holder opposite to the substrate holder, and configured to leak a magnetic field to a front surface of the target held by the target holder that is a surface close to the substrate holder, a driver configured to swing the magnet along a back surface of the target holder in the depth direction of the film forming apparatus, and a Gauss meter including a hole probe with a hole sensor provided therein and configured to measure a strength of the magnetic field, and the method comprising:

measuring the strength of the magnetic field; and determining a timing for replacing the target based on the measured strength of the magnetic field, wherein a tip of the hole probe is provided at a position substantially coincident with a center of the target held by the target holder in the depth direction of the film forming apparatus.

8. The film forming apparatus according to claim 1, wherein a length of the target in the depth direction of the film forming apparatus is longer than a length of the target in a direction perpendicular to the depth direction of the film forming apparatus.

9. The film forming apparatus according to claim 1, wherein the magnet includes a rectangular parallelepiped central magnet and an outer peripheral magnet having a rectangular ring shape in a plan view which are arranged on a flat plate-shaped yoke.

10. The film forming apparatus according to claim 9, wherein the central magnet and the outer peripheral magnet are magnetized in opposite directions in a direction perpendicular to a surface of the yoke close to the central magnet.

11. The film forming apparatus according to claim 9, wherein the magnet is provided such that the central magnet extends in a direction perpendicular to the depth direction of the film forming apparatus in a plan view.

12. The film forming apparatus according to claim 1, wherein a length of the magnet in a direction perpendicular to the depth direction of the film forming apparatus is substantially the same as a length of the target.

13. The film forming apparatus according to claim 1, further comprising:

a rail that extends along the depth direction of the film forming apparatus, wherein the magnet moves along the rail in the depth direction of the film forming apparatus by the driver.

14. The film forming apparatus according to claim 3, wherein the torque value of the motor is inversely proportional to a wear amount of the target.

\* \* \* \* \*